(12) United States Patent
Schneider et al.

(10) Patent No.: US 6,220,607 B1
(45) Date of Patent: Apr. 24, 2001

(54) THERMALLY CONDUCTIVE CONFORMAL MEDIA

(75) Inventors: Gerhard M. Schneider, Cupertino; Edwin C. Weldon, Los Gatos; Ananda H. Kumar, Milpitas; Kadthala R. Narendrnath, San Jose, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/062,380

(22) Filed: Apr. 17, 1998

(51) Int. Cl.$^7$ .................................................... F16J 15/00
(52) U.S. Cl. ............................................ 277/650; 277/933
(58) Field of Search ................................... 277/359, 360, 277/650, 652, 931, 933, 941

(56) References Cited

U.S. PATENT DOCUMENTS

| | | |
|---|---|---|
| 4,345,267 * | 8/1982 | Corman et al. . |
| 4,399,016 | 8/1983 | Tsukada et al. . |
| 4,404,734 | 9/1983 | Singh . |
| 4,662,967 * | 5/1987 | Bogan et al. . |
| 5,137,283 * | 8/1992 | Giarrusso et al. . |
| 5,173,259 | 12/1992 | Bordini . |
| 5,221,403 | 6/1993 | Nozawa et al. . |
| 5,275,683 | 1/1994 | Arami et al. . |
| 5,376,213 | 12/1994 | Ueda et al. . |
| 5,445,709 | 8/1995 | Kojima et al. . |
| 5,447,595 | 9/1995 | Nakagawa . |
| 5,508,613 | 4/1996 | Kotsubo et al. . |
| 5,556,500 | 9/1996 | Hasegawa et al. . |
| 5,591,034 | 1/1997 | Ameen et al. . |
| 5,622,593 | 4/1997 | Arasawa et al. . |
| 5,707,486 | 1/1998 | Collins . |
| 5,945,217 * | 8/1999 | Hanrahan . |

* cited by examiner

Primary Examiner—Anthony Knight
Assistant Examiner—Karlena D. Schwing
(74) Attorney, Agent, or Firm—Townsend and Townsend & Crew

(57) ABSTRACT

A thermally conductive medium includes a body with a first melting point and phase-changing material encapsulating a portion of the body, with the phase-changing material having a second melting point. The first melting point is greater than the second melting point, and the phase-changing material is configured to be in a liquid phase at temperatures above the second melting point and a solid phase at temperatures below the same. In the liquid phase, an adhesive force is present between the body and the phase-changing material due to capillary attraction, and the phase-changing material may be wettable to one of the two surfaces.

25 Claims, 2 Drawing Sheets

THERMALLY CONDUCTIVE CONFORMAL MEDIA

BACKGROUND OF THE INVENTION

The present invention relates to thermal interfaces. Specifically, the present invention is directed to thermally conductive media ideally suited for systems which cycle over a range of temperatures.

Conventional thermal interface media reduce the temperature gradient between two different surfaces in close proximity with one another. The surfaces are typically mating surfaces. Conventional interface media are positioned in the gaps or voids between the two surfaces so that the thermal resistance is lowered, thereby allowing the heat to flow away from the hotter surface. The efficient flow of heat may be impeded if any gaps or voids remain at the interface surfaces. Therefore, not only must the interface medium be thermally conductive, but it must also compensate for certain manufacturing tolerances inherent in the interface.

Thermal paste is a common interface medium that provides heat transfer as well as conformal properties. A typical thermal paste may contain a mixture of zinc oxide in mineral oil. Thermal conductivity is achieved by peculating oxide particles in a low conductivity oil matrix.

U.S. Pat. No. 5,198,189 to Booth et al. discloses, in pertinent part, a liquid metal matrix thermal paste in which non-reacting thermally conductive particles are dispersed in a metal matrix having a low melting temperature. The particles are silicon, molybdenum, tungsten or other materials which do not react with gallium at temperatures below approximately 100° C. The preferred liquid metals are described as gallium and indium eutectic, gallium and tin eutectic, and gallium, indium and tin ternary eutectic. The liquid metal matrix thermal paste is described as being used for cooling high power dissipation components in conjunction with a conventional fluid cooling system. The paste may be cleaned from surfaces by using metal wool containing tin or copper filaments.

The use of thermally conductive pastes, however, is problematic. The paste must be applied with precision. If applied in incorrect quantities, e.g., if too thick, the heat transfer performance degrades. In addition, unwanted material, such as machining chips, tends to collect in the paste so that even larger gaps are produced, which can also reduce heat transfer performance. This problem is exacerbated by the difficulty of removing the paste without leaving a residue.

Thermally conductive gaskets overcome the problem associated with removing the paste from the interface. U.S. Pat. No. 4,776,602 to Paul E. Gallo discloses a conventional thermally conductive gasket that includes a metallic core with an upper and lower face. The core is fabricated from tin plated stainless or low carbon steel. A thermally conductive expandable graphite material contacts with the upper face. A pair of compressible non-asbestos facing layers are disposed on opposing sides of the core and comprise of clay, rubber, and aramid fibers. Tangs are formed in the core to clinch together all the layers in the device.

U.S. Pat. No. 5,137,283 to Giarusso et al. discloses, in pertinent part, a thermally conductive gasket formed by encapsulating a thermally conductive low melting temperature material in a plastic skin. The low melting temperature material conforms to the shape of the interface so as to completely fill the voids once heated above the aforementioned melting temperature. This provides a gasket which is easily applied and removed from the interface, thereby affording a re-usable gasket.

U.S. Pat. No. 5,459,352 to Layton et al. discloses, in pertinent part, a liquid metal aluminum/copper thermal conductor to provide a path for conducting heat from a chip to a fluid medium. In one embodiment, the thermal conductor is described as being formed from a fibrous metal body coated with a liquid metal alloy. The liquid metal alloy may include gallium, indium, selenium, zinc, or mercury. However, conventional thermal gaskets have limited compressibility necessitating increased thickness to fill voids which reduces the heat transfer qualities of the same.

What is needed, therefore, is a highly conformal thermally conductive medium that is reusable.

SUMMARY OF THE INVENTION

The present invention provides a reusable thermally conductive medium for increasing the thermal transfer at an interface between two surfaces while having increased conformableness to the surfaces. The present invention does so by having a body with a first melting point and encapsulating a portion of the body with a phase-changing material having a second melting point. The first melting point is greater than the second melting point, and the phase-changing material is configured to be in a liquid phase at temperatures above the second melting point and a solid phase at temperatures below the same.

In the liquid phase, an adhesive force is present between the body and the phase-changing material due to capillary attraction. In a first embodiment, the phase-changing material is non-wetting to the two surfaces. This prevents separation of the phase-changing material from the body, and facilitates easy removal of the thermally conductive medium from the two surfaces. A good thermally conductive seal between the two surfaces is ensured by the conformability of the phase-changing material when in the liquid phase. The conformableness of the phase-changing material facilitates a reduction in gas pockets being present between the two surfaces and the thermally conductive medium. To achieve the conformableness the phasechanging material must be heated above the second melting point. Thereafter, improved thermal conductive may result even at temperatures below the second melting point, due to the reduction in gas pockets that has been achieved by phase-changing material conforming to the shape of the two surfaces adjacent to the thermally conductive medium. In a second embodiment, the phase-changing material wets one of the two surfaces. This allows fixedly securing the thermally conductive medium to one of the two surfaces and improves thermal conduction between the thermally conductive medium and the surface which the phase-changing material wets.

In an exemplary embodiment, the body is formed from a thermally conductive material such as a plurality of interwoven metal threads, defining a plurality of interstices therebetween. The phase-changing material is also composed of a metal. A sufficient quantity of the phase-changing material is present in the liquid phase to allow complete filling of the plurality of interstices. In this fashion, most of the gas pockets may be removed from the volume of the interface between the two surfaces. Although any metal may be employed in accordance with this invention, in the exemplary embodiment the body is formed from copper wool, and the phase-changing material is formed from indium which coats the surface of the plurality of metal threads.

An exemplary use of the disclosed invention is discussed in conjunction with an inductively coupled reactor chamber ideally suited for etching processes. The reactor chamber is defined by a side wall and a circular ceiling integrally formed with the side wall. A supply of process gases is in fluid communication with the reactor chamber via feed channels. The ceiling may have any cross-sectional shape desired, e.g., rectangular, arcuate, conical, truncated conical, cylindrical, or any combination of such shapes or curves of rotation. The ceiling includes inner and outer opposed surfaces, with the inner surface facing the reactor chamber. A pedestal is positioned within the chamber, spaced-apart from the inner surface. The pedestal supports a workpiece, typically a semiconductor wafer, during processing.

A temperature control apparatus is in thermal communication with the ceiling and faces the outer major surface. The temperature control apparatus includes a thermally conductive torus having opposed surfaces with a plurality of axial bores extending therebetween, and a cold plate resting against one of the opposed surfaces. A housing is disposed within the central throughway, and a coil antenna is wound about the housing. The coil antenna is in electrical communication with a plasma source RF power supply, and a bias power supply is connected to the pedestal. Each of the axial bores is arranged radially symmetrically about an axis of a central throughway of the torus. The axial bores are arranged in one of two groups, with each group of axial bores being positioned at differing radial position with respect to the axis. Disposed within each of axial bores is a radiant heater or lamp. To ensure efficient thermal communication between the ceiling and the torus, the present invention is disposed therebetween. In addition, the present invention may be disposed between the cooling plate and the torus.

DETAILED DESCRIPTION OF THE PREFERRED EMBODIMENTS

Figure 1:
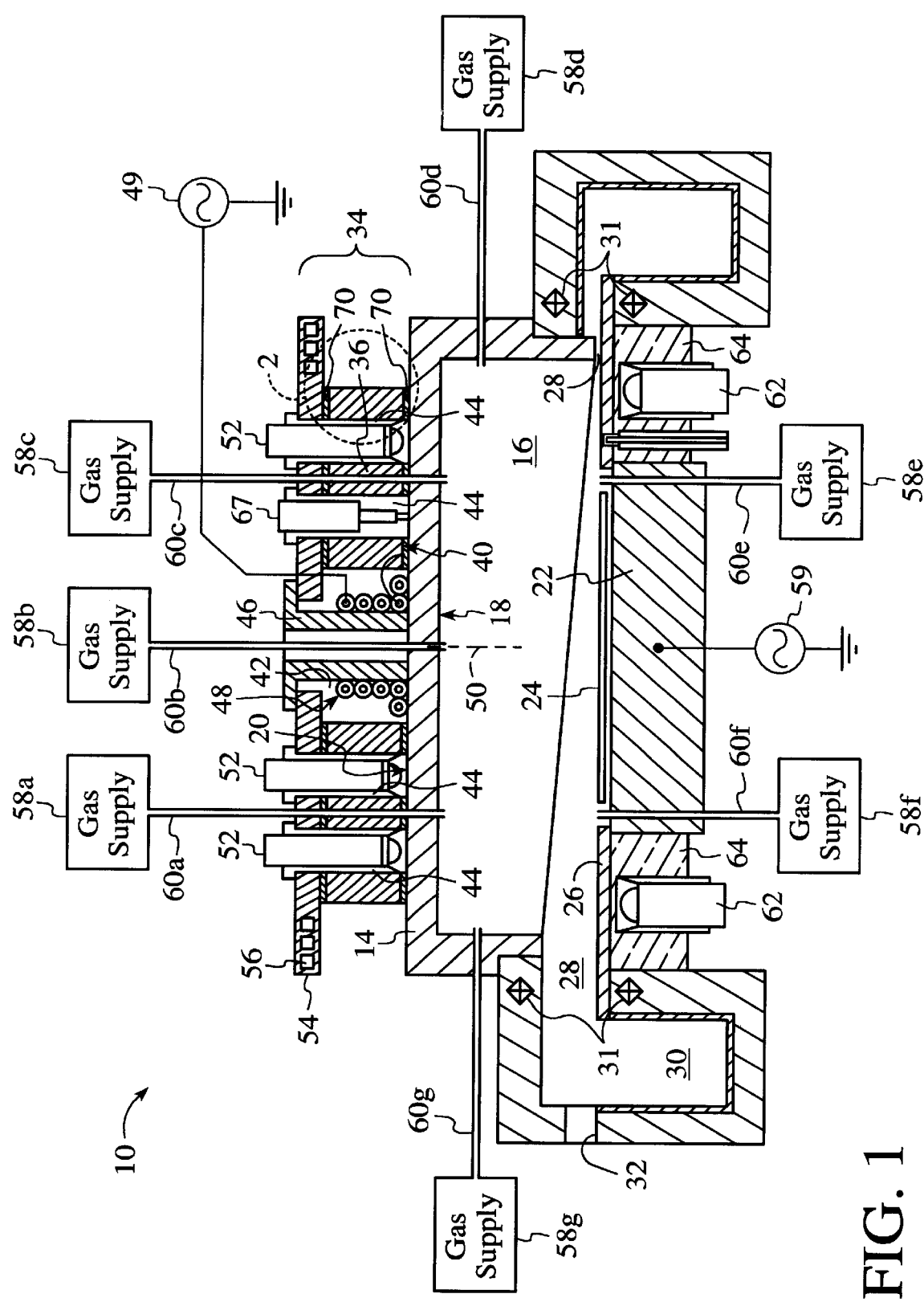
FIG. 1 is a cross-sectional view of an inductively coupled plasma reactor incorporating thermally conductive media in accord with the present invention.

Referring to FIG. 1, an inductively coupled RF plasma reactor system 10 is shown having a side wall 12 and a ceiling 14 integrally formed with the side wall 12, defining an upper portion of a cylindrical reactor chamber 16. The ceiling 14 may have any cross-sectional shape desired, e.g., rectangular, arcuate, conical, truncated conical, cylindrical, or any combination of such shapes or curves of rotation. The ceiling 14 includes inner and outer opposed surfaces 18 and 20, with the inner surface 18 facing the reactor chamber 16. A pedestal 22 is spaced-apart from the inner surface 18. The pedestal supports a work piece 24, typically a semiconductor wafer, during processing. Surrounding the pedestal is a planar ring 26. An annular passage 28 is defined by a bottom edge of the cylindrical side wall 12 and a planar ring 26, with the planar ring 26 and the pedestal 22 defining one side of the chamber 16. The annular passage 28 is in fluid communication with a pumping annulus 30 which is disposed adjacent to and spaced apart from the pedestal 22. The interior of the pumping annulus may be lined with a removable liner. A wafer slit valve 32 is formed in a wall of the pumping annulus 30 to accommodate wafer ingress and egress with the chamber 16. A portion of the annular passage 28 positioned between the reactor chamber 16 and pumping annulus 30 is larger than a portion of the annular passage 28 disposed opposite thereto by virtue of a slant of the bottom edge of the side wall 12. Plasma confinement magnets 33 are located adjacent to the annular passage 28 to reduce plasma flow into the pumping annulus 30.

A temperature control apparatus 34 is in thermal communication with the ceiling 14 and faces the outer surface 20. The temperature control apparatus 34 includes a torus 36 which is formed from a thermally conductive material, e.g., ceramic such as aluminum nitride, aluminum oxide, or silicon nitride, or a non-ceramic such as doped or undoped silicon. The torus 36 has opposed surfaces 38 and 40 with a central throughway 42 and a plurality of axial bores 44 extending therebetween. A housing 46 is disposed within the central throughway 42, and a coil antenna 48 is wound about the housing 46. The coil antenna 48 is in electrical communication with a plasma source RF power supply 49, and a bias power supply 59 is connected to the pedestal The axial bores 44 are arranged radially symmetrically about an axis 50 of the central throughway 42 of the torus 36. The axial bores 44 are arranged two groups, with each group of axial bores 44 being positioned at differing radial positions with respect to the axis 50. Disposed within a subset of the axial bores 44 is a radiant heater 52, such as a tungsten halogen lamp. Bores having radiant heaters 52 associated therewith may be lined with a reflective layer, e.g., an aluminum layer. A thermocouple 67 may extend through one of the remaining axial bores 44 is to sense the temperature of the ceiling 14. One of the opposed surfaces 40 rests against the outer surface 20 of the ceiling 14, with the remaining opposed surface 38 supporting a cold plate 54.

The cold plate 54 may be formed of copper or aluminum, for example, and includes coolant passages 56. The coolant passages 56 preferably contain a coolant (not shown) of a known variety having a high thermal conductivity and low electrical conductivity. In this fashion, electrical loading of the coil antenna 48 is reduced. The dimensions of the cold plate 56 and coolant passages 56 are defined so that a predetermined amount of thermal dissipation may be achieved for a given coolant. The radiant heaters 52, however, are chosen so as to provide a greater quantity of thermal flux than the aforementioned thermal dissipation. This facilitates control of the temperature of the ceiling 14.

A supply of process gases, shown generally as 58a–58g, are in fluid communication with the reactor chamber 16 via feed channels shown generally as 60a–60g. A center gas feed channel 60b, extends downwardly through the center of the ceiling toward the center of the work piece, and a plurality of radial gas feed channels 60d and 60g extend radially inwardly from the side wall 12 toward the periphery of the work piece 24. Alternatively, base axial gas feed channels 60c and 60f may extend upwardly through the pedestal 22 and terminate proximate to the periphery of the work piece 24, or ceiling axial gas feed channels 60a and 60c may extend downwardly from the ceiling 14 toward the periphery of the work piece. Typically, the center gas feed channel 60b may be controlled independently of the remaining gas feed channels 60a and 60c–g.

During operation, the reactor chamber 16 is evacuated by a pump (not shown) through the annular passage 28 and the pumping annulus 30. A process gas is introduced into the reactor chamber 16, from one or more of the gas supplied 58a–g, through any one or all of the gas feed channels 60a–60g associated therewith. The center gas feed channel 60b controls the flow of process gas proximate to the center of the work piece 24. The flow of process gas proximate to the periphery of the work piece 24 is controlled by the remaining gas feed channels 60a, 60c–60g. Etch rates at the center and periphery workpiece 24 can be adjusted independently relative to one another. In this manner, a more radially uniform etch rate over the area of the work piece 24 is achieved by regulating the process gas flow rates from the gas supplies 58a–g.

Typical process gases include a fluorine source, often necessitating the presence of a fluorine scavenger within the reactor chamber 16. In one embodiment, fluorine scavenger material may be disposed within the reactor chamber 16 in the form of a disposable silicon ring which surrounds the pedestal 22. To that end, the planar ring 26 may be formed from a high purity silicon and may be doped to alter its electrical or optical properties. To prevent polymer condensation upon the planar ring 26, while facilitating movement of silicon material into the plasma, the planar ring 26 may be heated. To that end, a plurality of radiant lamps 62 are arranged so as to be proximate to the planar ring 26, with a quartz window 64 placed therebetween. A sensor 66 is placed to detect the temperature of the planar ring 26. The sensor 66 may be a remote sensor, such as an optical pyrometer, or a fluoro-optical probe. Typically, the sensor extends partially into a recess 68 formed into the planar ring 26 which is dimensioned to mask temperature-dependent variations in thermal emissivity of the planar ring 26.

In an alternative embodiment, the ceiling 14 and the side wall 12 may both be formed from the fluorine scavenger, e.g., silicon. The extent to which the ceiling 14 and side wall 12 facilitate movement of the fluorine scavenger material into the plasma is a function of the temperature of the same and the extent to which the ceiling 14 and side wall 12 become coated with a polymer. The temperature of the ceiling 14 and the side wall 12 is regulated by the RF bias power applied thereto, as well as the temperature control apparatus 34. It should be understood, however, that in addition to silicon, the ceiling 14 may be formed from silicon carbide, silicon dioxide (quartz), silicon nitride, or other ceramics. If additional silicon is required, the planar ring 26 may be used in conjunction with the aforementioned ceiling 14 and side wall 12. If it is desired simply to consume the silicon planar ring 26, the temperature of the ceiling 14 and side wall 12 may be maintained at a temperature (and/or RF bias) near or below the polymer condensation temperature (and/or a polymer condensation RF bias threshold). In this manner, the ceiling and side wall become coated with polymer from the plasma and will not contribute material to the plasma even if formed from silicon.

Figure 2:
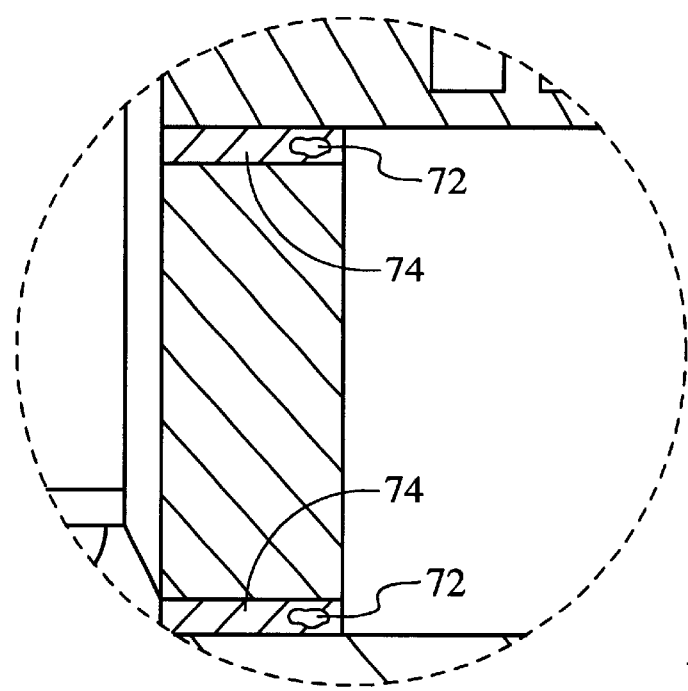
FIG. 2 is a detailed view of the inductively coupled plasma reactor shown in FIG. 1.

Referring to both FIGS. 1 and 2, an important consideration during processing is to efficiently control the temperature of the ceiling 14 so that it is uniform, because the rate of polymer deposition across the entire ceiling 14 and/or the rate at which the ceiling 14 furnishes a fluorine scavenger material is a function of the ceiling 14 temperature. To that end, good thermal contact between the temperature control apparatus 34 and the ceiling 14 is facilitated by a highly thermally conductive medium 70 disposed therebetween. In the preferred embodiment, the thermally conductive medium 70 includes a thermally conductive body 72 which is either partially or totally encapsulated by a thermally conductive material 74 that has a lower melting point than the body 72. The melting point of both the conductive body 72 and the thermally conductive material 74 are chosen so that the body maintains a solid phase while the thermally conductive material 74 undergoes a phase change between a solid and a liquid phase. Thus, the thermally conductive material 74 is referred to as a phase-changing material. The phase change may be achieved either during processing of the workpiece 24 or at an initial step to establish the conformal shape of the phase-changing material 74 should the temperatures during processing never exceed the melting point of the phase-changing material 74.

Figure 3:
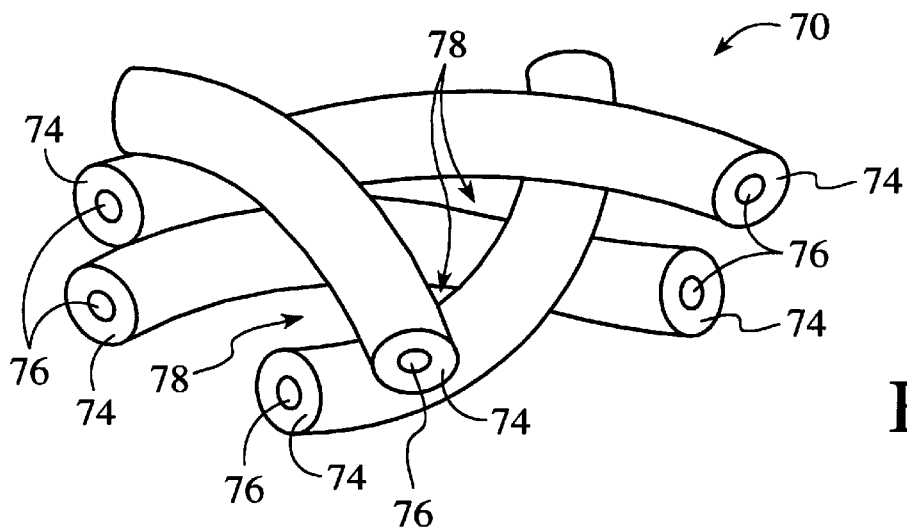
FIG. 3 is a detailed view of a portion of the thermally conductive media shown in FIG. 2.

In an exemplary embodiment, the body 72 is formed from copper wool, having a plurality of interwoven copper threads 76 with spaces between the threads defining a plurality of interstices 78, shown more clearly in FIG. 3. The phase-changing material 74 is indium which either partially or totally coats each of the copper threads 76.

In operation, the heat generated by the lamps 52 causes the phase-changing material 74 to assume a liquid phase. During the liquid phase, the phase-changing material 74 substantially or completely fills the interstices 78 between the plurality of copper threads 76. In addition, the liquid phase of the phase-changing material 74 facilitates the conformability of the thermally conductive medium 70 to the surfaces adjacent thereto. In this fashion, any gaps which were present between the thermally conductive medium 70 and the surfaces adjacent thereto, in this example, the torus surface 40 and the ceiling surface 20, are purged by ingress of the phase-changing material 74. The purging action of the phase-changing material allows the interface between the torus 36 and the ceiling 14 to be completely filled with the thermally conductive medium 70. By removing air between the interface, the thermal conductivity between the ceiling 14 and the temperature control apparatus 34 is greatly improved. Thereafter, improved thermal conductivity may result even at temperatures below the second melting point, due to the reduction in gas pockets that has been achieved by phase-changing material conforming to the shape of the torus surface 40 and the ceiling surface 20.

To prevent air from moving between the phase-changing material 74 and the surfaces adjacent thereto, the phase-changing material 74 and the body 72 are chosen so that the probability of separation is reduced. This is achieved by the presence of an adhesive force between the body 72 and the phase-changing material 74 during the liquid phase. This adhesive force is due to capillary attraction. The capillary attraction ensures that the body 72 and the phase-changing material 74 do not separate in the presences of translational motion between the thermally conductive medium 70 and the surfaces adjacent thereto from, for example, differences in coefficients of thermal expansion or vibrations.

In addition, the adhesive forces between the body 72 and the phase-changing material 74 also reduce contamination of the surfaces adjacent to the thermally conductive medium, e.g., torus surface 40 and ceiling surface 20. Upon cooling, the phase-changing material 74 tends to rest adjacent to the surface with which it has the greatest capillary attraction once solidified. By providing the greater adhesive attractive force between the body 72 and the phase-changing material 74, the amount of phase-changing material 74 adhering to the body 72 is maximized, once the gasket it cooled. This greatly reduces the amount of residue of the thermally conductive medium left upon the surfaces disposed adjacent thereto. This may be achieved by selecting the material components of the thermally conductive medium 70 so that the phase-changing material 74 wets only the body 72 and not the torus surface 40 and the ceiling surface 20 which are adjacent to the thermally conductive medium. One manner in which to achieve this result is to oxidize the surfaces adjacent to the thermally conductive medium 70. Although any metal may be employed in accordance with this invention, in the exemplary embodiment, the body 72 is formed from copper wool, and the phase-changing material 74 is formed from indium which coats the surface of the plurality of metal threads. However, the body 72 may be coated with a material, such as nickel, to ensure wetting of the same by the phase-changing material 74.

In another embodiment, the thermally conductive medium 70 includes phase-changing material 74 that wets one of the two surfaces 20 and 40. This allows fixedly securing the thermally conductive medium to one of these surfaces. Specifically, one of the surfaces 20 and 40 may be cleaned to remove oxidation. To ensure wettability, one of the surfaces may be plated with a material which the phase-changing material 74 will wet, e.g., copper or nickel. Thus, once the phase-changing material 74 undergoes a phase change from liquid to solid, the thermally conductive medium 70 will be fixedly attached to the wettable surface. The scope of the invention should be determined not with reference to the description above, but instead should be determined with reference to the appended claims along with their full scope of equivalents.

What is claimed is:

1. A thermally conductive gasket to be placed against a surface, said gasket comprising:
    a body having a first melting point; and
    phase-changing material having a second melting point, with a portion of said body being encapsulated by said phase-changing material and said first melting point being greater than said second melting point, said phase-changing material being in a liquid phase at temperatures above said second melting point.

2. The gasket as recited in claim 1 wherein said body includes a plurality of interwoven metal threads defining a plurality of interstices therebetween.

3. The gasket as recited in claim 1 wherein said phase-changing material is formed from thermally conductive material.

4. The gasket as recited in claim 1 wherein both said body and said phase-changing material is formed from thermally conductive material.

5. The gasket as recited in claim 1 wherein said body is formed from copper.

6. A thermally conductive gasket to be placed against a surface, said gasket comprising:
    a body having a first melting point; and
    phase-changing material having a second melting point, with a portion of said body being encapsulated by said phase-changing material and said first melting point being greater than said second melting point, said phase-changing material being in a liquid phase at temperatures above said second melting point;
    wherein said phase-changing material is non-wetting to said surface.

7. The gasket as recited in claim 6 wherein a sufficient quantity of said phase-changing material is present in said liquid phase to allow said gasket to completely fill said plurality of interstices.

8. A thermally conductive gasket to be placed against a surface, said gasket comprising:
    a body having a first melting point; and
    phase-changing material having a second melting point, with a portion of said body being encapsulated by said phase-changing material and said first melting point being greater than said second melting point, said phase-changing material being in a liquid phase at temperatures above said second melting point;
    wherein said surface is a ceiling of a wall of a semiconductor process chamber.

9. The gasket as recited in claim 8 wherein said body includes a plurality of interwoven metal threads defining a plurality of interstices therebetween.

10. The gasket as recited in claim 8 wherein said phase-changing material is formed from thermally conductive material.

11. The gasket as recited in claim 8 wherein said body is formed from copper.

12. A thermally conductive gasket of the type to be placed between two surfaces, defining an interface having a volume, said gasket comprising:
    a body having a first melting point; and
    phase-changing material having a second melting point, with a portion of said body being encapsulated by said phase-changing material and said first melting point being greater than said second melting point, said phase-changing material being in a liquid phase at temperatures above said second melting point with a first attractive force being present between said body and said phase-changing material and a second attractive force being present between said surface and said phase-changing material, said first attractive force being greater than said second attractive force.

13. The gasket as recited in claim 12 wherein said phase-changing material is wettable to one of said two surfaces.

14. The gasket as recited in claim 13 wherein said phase-changing material is non-wettable to both said two surfaces.

15. The gasket as recited in claim 14 wherein said body includes a plurality of interwoven metal threads defining a plurality of interstices therebetween.

16. The gasket as recited in claim 15 wherein said body is copper wool.

17. The gasket as recited in claim 16 wherein said phase-changing material is formed from thermally conductive material.

18. The gasket as recited in claim 17 wherein said phase-changing material is formed from indium.

19. The gasket as recited in claim 18 wherein said surface is a ceiling of a wall of a semiconductor process chamber.

20. The gasket as recited in claim 18 wherein said surface is associated with a first metallic element of a substrate processing apparatus that further includes a second metallic element with said first metallic element adapted to undergo temperature fluctuations during operation and said gasket is in intimate contact with said surface and said second metallic element.

21. The gasket as recited in claim 20 wherein a sufficient quantity of said phase-changing material is present in said liquid phase to allow said gasket to completely fill said plurality of interstices.

22. A thermally conductive gasket to rest against a surface, said gasket comprising:
    a body having a first melting point; and
    means, encapsulating a portion of said body, for selectively changing between a solid phase and a liquid phase, with capillary action being present in said liquid phase creating a first adhesive force between said body and said selectively changing means and a second adhesive force between said surface and said selectively maintaining means, with said first adhesive force being greater than said second adhesive force.

23. The gasket as recited in claim 22 wherein said body includes a plurality of interwoven metal threads defining a plurality of interstices therebetween with a portion of each of said plurality of threads with said changing means including layer of indium covering a subgroup of said threads, with a sufficient quantity of said phase-changing material being present in said liquid phase to allow said gasket to completely fill said plurality of interstices.

24. A thermally conductive gasket to be placed against a surface, said gasket comprising:

a body having a first melting point; and phase-changing material having a second melting point, with a portion of said body being encapsulated by said phase-changing material and said first melting point being greater than said second melting point, said phase-changing material being in a liquid phase at temperatures above said second melting point;

wherein said phase-changing material is formed from indium.

25. A thermally conductive gasket to be placed against a surface, said gasket comprising:

a body having a first melting point; and phase-changing material having a second melting point, with a portion of said body being encapsulated by said phase-changing material and said first melting point being greater than said second melting point, said phase-changing material being in a liquid phase at temperatures above said second melting point;

wherein said surface is associated with a first metallic element of a substrate processing apparatus that further includes a second metallic element with said first metallic element adapted to undergo temperature fluctuations during operation and said gasket is in intimate contact with said surface and said second metallic element.

* * * * *